(12) United States Patent
Huang et al.

(10) Patent No.: US 12,255,131 B2
(45) Date of Patent: Mar. 18, 2025

(54) CAPACITOR BETWEEN TWO PASSIVATION LAYERS WITH DIFFERENT ETCHING RATES

(71) Applicant: Taiwan Semiconductor Manufacturing Co., Ltd., Hsinchu (TW)

(72) Inventors: Chia-Ming Huang, Tainan (TW); Ming-Da Cheng, Taoyuan (TW); Songbor Lee, Zhubei (TW); Jung-You Chen, Zhubei (TW); Ching-Hua Kuan, Kaohsiung (TW); Tzy-Kuang Lee, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/365,009

(22) Filed: Aug. 3, 2023

(65) Prior Publication Data
US 2023/0378052 A1    Nov. 23, 2023

Related U.S. Application Data

(62) Division of application No. 17/197,483, filed on Mar. 10, 2021, now Pat. No. 11,935,826.
(Continued)

(51) Int. Cl.
| H01L 23/522 | (2006.01) |
| H01L 23/00 | (2006.01) |
| H01L 49/02 | (2006.01) |

(52) U.S. Cl.
CPC ...... *H01L 23/5223* (2013.01); *H01L 23/5226* (2013.01); *H01L 24/03* (2013.01);
(Continued)

(58) Field of Classification Search
CPC . H01L 23/5223; H01L 23/5226; H01L 24/03; H01L 28/60; H01L 2224/02311;
(Continued)

(56) References Cited

U.S. PATENT DOCUMENTS 9,793,339 B2    10/2017   Chu et al.
10,522,488 B1   12/2019   Chen et al.
(Continued)

FOREIGN PATENT DOCUMENTS

CN    105789186 A    7/2016
CN    110021533 A    7/2019
(Continued)

*Primary Examiner* — Thanh T Nguyen
(74) *Attorney, Agent, or Firm* — Slater Matsil, LLP

(57) ABSTRACT

A method includes depositing a first passivation layer over a conductive feature, wherein the first passivation layer has a first dielectric constant, forming a capacitor over the first passivation layer, and depositing a second passivation layer over the capacitor, wherein the second passivation layer has a second dielectric constant greater than the first dielectric constant. The method further includes forming a redistribution line over and electrically connecting to the capacitor, depositing a third passivation layer over the redistribution line, and forming an Under-Bump-Metallurgy (UBM) penetrating through the third passivation layer to electrically connect to the redistribution line.

20 Claims, 16 Drawing Sheets

Related U.S. Application Data

(60) Provisional application No. 63/030,597, filed on May 27, 2020.

(52) U.S. Cl.
CPC .... *H01L 28/60* (2013.01); *H01L 2224/02311* (2013.01); *H01L 2224/02313* (2013.01)

(58) Field of Classification Search
CPC ........... H01L 2224/02313; H01L 24/11; H01L 24/13; H01L 24/16; H01L 24/73; H01L 24/81; H01L 2224/16225; H01L 2224/32225; H01L 2224/73204; H01L 2224/81801; H01L 2924/14; H01L 2924/181; H01L 2221/1005; H01L 27/0688; H01L 23/5329; H01L 21/82; H01L 21/76835; H01L 2224/0401; H01L 2224/02381; H01L 2224/02333; H01L 24/02
See application file for complete search history.

(56) References Cited

U.S. PATENT DOCUMENTS

| | | | |
|---|---|---|---|
| 11,031,458 | B2 | 6/2021 | Huang et al. |
| 11,145,564 | B2 | 10/2021 | Huang et al. |
| 2012/0181657 | A1 | 7/2012 | Wu et al. |
| 2016/0218063 | A1 | 7/2016 | Tsai et al. |
| 2019/0103352 | A1* | 4/2019 | Chou ........... H01L 28/40 |
| 2019/0164867 | A1 | 5/2019 | Hu et al. |
| 2019/0198481 | A1 | 6/2019 | Lee |
| 2020/0006183 | A1* | 1/2020 | Huang ........... H01L 24/08 |

FOREIGN PATENT DOCUMENTS

| | | |
|---|---|---|
| CN | 110660685 A | 1/2020 |
| CN | 111128750 A | 5/2020 |
| TW | 201917901 A | 5/2019 |
| TW | 202006796 A | 2/2020 |

* cited by examiner

CAPACITOR BETWEEN TWO PASSIVATION LAYERS WITH DIFFERENT ETCHING RATES

PRIORITY CLAIM AND CROSS-REFERENCE

This application is a divisional of U.S. patent application Ser. No. 17/197,483, filed Mar. 10, 2021, and entitled "Capacitor Between Two Passivation Layers With Different Etching Rates," which claims the benefit of the U.S. Provisional Application No. 63/030,597, filed on May 27, 2020, and entitled "Semiconductor Package Device with MIM device disposed between two dielectric layers made of different materials," which applications are hereby incorporated herein by reference.

BACKGROUND

In the formation of integrated circuits, integrated circuit devices such as transistors are formed at the surface of a semiconductor substrate in a wafer. An interconnect structure is then formed over the integrated circuit devices. A metal pad is formed over, and is electrically coupled to, the interconnect structure. A passivation layer and a first polymer layer are formed over the metal pad, with the metal pad exposed through the openings in the passivation layer and the first polymer layer.

A redistribution line may then be formed to connect to the top surface of the metal pad, followed by the formation of a second polymer layer over the redistribution line. An Under-Bump-Metallurgy (UBM) is formed extending into an opening in the second polymer layer, wherein the UBM is electrically connected to the redistribution line. A solder ball may be placed over the UBM and reflowed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
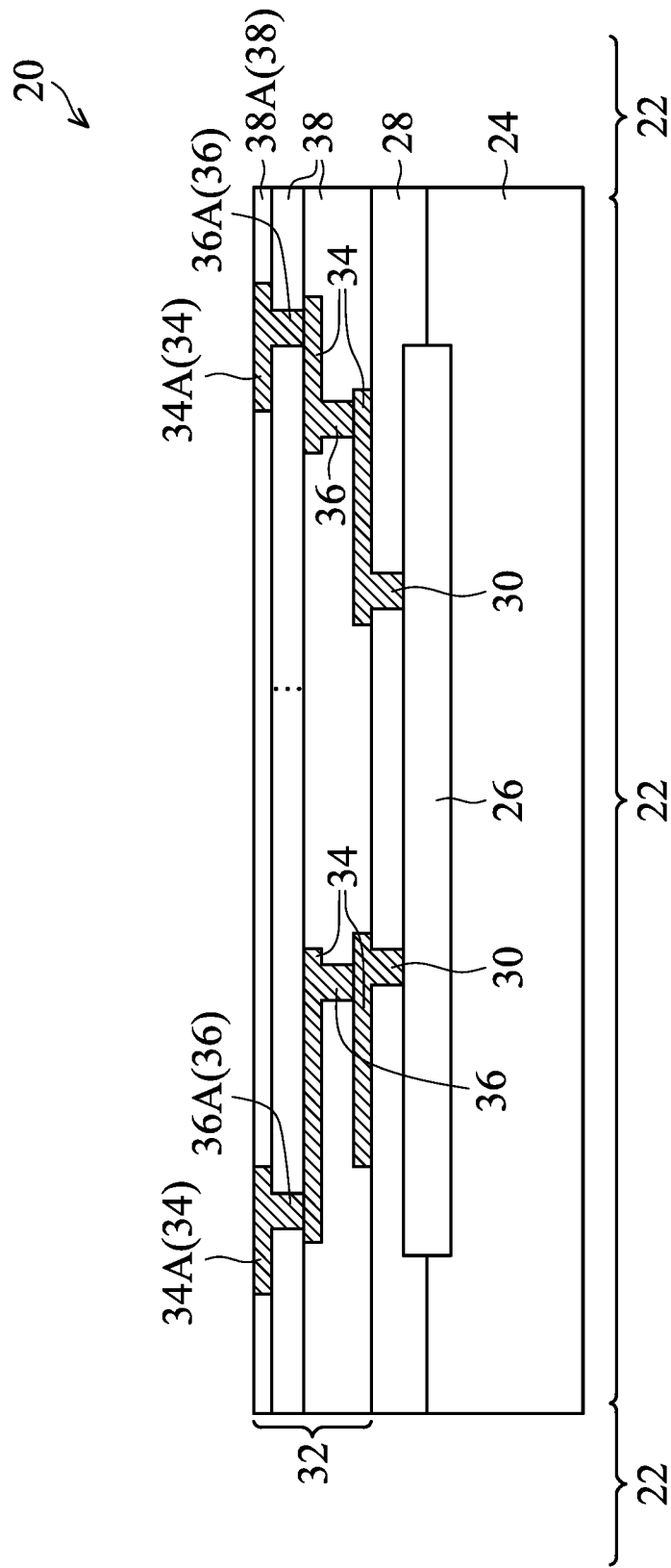
FIGS. 1 through 15 illustrate the cross-sectional views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device and the method of forming the same are provided in accordance with some embodiments. The device includes a capacitor, which may be a Metal-Insulator-Metal (MIM) capacitor. The capacitor is formed over a first passivation layer, and is covered by a second passivation layer. The first passivation layer has a lower-k value than the second passivation layer. When etched using a same etching gas, the first passivation layer is etched faster than the second passivation layer, so that in the etching processes, loading effect is reduced. The intermediate stages in the formation of the package are illustrated in accordance with some embodiments. Some variations of some embodiments are discussed. Throughout the various views and illustrative embodiments, like reference numbers are used to designate like elements.

FIGS. 1 through 15 illustrate the cross-sectional views of intermediate stages in the formation of a device in accordance with some embodiments of the present disclosure. The corresponding processes are also reflected schematically in the process flow 200 as shown in FIG. 16. It is appreciated that although a device wafer and a device die are used as examples, the embodiments of the present disclosure may also be applied to form conductive features in other devices (package components) including, and not limited to, package substrates, interposers, packages, and the like.

FIG. 1 illustrates a cross-sectional view of integrated circuit device 20. In accordance with some embodiments of the present disclosure, device 20 is or comprises a device wafer including active devices and possibly passive devices, which are represented as integrated circuit devices 26. Device 20 may include a plurality of chips 22 therein, with one of chips 22 being illustrated. In accordance with alternative embodiments of the present disclosure, device 20 is an interposer wafer, which is free from active devices, and may or may not include passive devices. In accordance with yet alternative embodiments of the present disclosure, device 20 is or comprises a package substrate strip, which includes a core-less package substrate or a cored package substrate with a core therein. In subsequent discussion, a device wafer is used as an example of device 20, and device 20 may also be referred to as wafer 20. The embodiments of the present disclosure may also be applied on interposer wafers, package substrates, packages, etc.

In accordance with some embodiments of the present disclosure, wafer 20 includes semiconductor substrate 24 and the features formed at a top surface of semiconductor substrate 24. Semiconductor substrate 24 may be formed of or comprise crystalline silicon, crystalline germanium, silicon germanium, carbon-doped silicon, or a III-V compound semiconductor such as GaAsP, AlInAs, AlGaAs, GaInAs, GaInP, GaInAsP, or the like. Semiconductor substrate 24 may also be a bulk semiconductor substrate or a Semiconductor-On-Insulator (SOI) substrate. Shallow Trench Isolation (STI) regions (not shown) may be formed in semiconductor substrate 24 to isolate the active regions in semiconductor substrate 24. Although not shown, through-vias may (or may not) be formed to extend into semiconductor substrate 24, wherein the through-vias are used to electrically inter-couple the features on opposite sides of wafer 20.

In accordance with some embodiments of the present disclosure, wafer 20 includes integrated circuit devices 26, which are formed on the top surface of semiconductor substrate 24. Integrated circuit devices 26 may include Complementary Metal-Oxide Semiconductor (CMOS) transistors, resistors, capacitors, diodes, and the like in accordance with some embodiments. The details of integrated circuit devices 26 are not illustrated herein. In accordance with alternative embodiments, wafer 20 is used for forming interposers (which are free from active devices), and substrate 24 may be a semiconductor substrate or a dielectric substrate.

Inter-Layer Dielectric (ILD) 28 is formed over semiconductor substrate 24 and fills the spaces between the gate stacks of transistors (not shown) in integrated circuit devices 26. In accordance with some embodiments, ILD 28 is formed of Phospho Silicate Glass (PSG), Boro Silicate Glass (BSG), Boron-doped Phospho Silicate Glass (BPSG), Fluorine-doped Silicate Glass (FSG), silicon oxide, or the like. ILD 28 may be formed using spin coating, Flowable Chemical Vapor Deposition (FCVD), or the like. In accordance with some embodiments of the present disclosure, ILD 28 is formed using a deposition method such as Plasma Enhanced Chemical Vapor Deposition (PECVD), Low Pressure Chemical Vapor Deposition (LPCVD), or the like.

Contact plugs 30 are formed in ILD 28, and are used to electrically connect integrated circuit devices 26 to overlying metal lines and vias. In accordance with some embodiments of the present disclosure, contact plugs 30 are formed of or comprise a conductive material selected from tungsten, aluminum, copper, titanium, tantalum, titanium nitride, tantalum nitride, alloys thereof, and/or multi-layers thereof. The formation of contact plugs 30 may include forming contact openings in ILD 28, filling a conductive material(s) into the contact openings, and performing a planarization process (such as a Chemical Mechanical Polish (CMP) process or a mechanical grinding process) to level the top surfaces of contact plugs 30 with the top surface of ILD 28.

Over ILD 28 and contact plugs 30 resides interconnect structure 32. Interconnect structure 32 includes metal lines 34 and vias 36, which are formed in dielectric layers 38 (also referred to as Inter-metal Dielectrics (IMDs)). The metal lines at a same level are collectively referred to as a metal layer hereinafter. In accordance with some embodiments of the present disclosure, interconnect structure 32 includes a plurality of metal layers including metal lines 34 that are interconnected through vias 36. Metal lines 34 and vias 36 may be formed of copper or copper alloys, and they can also be formed of other metals. In accordance with some embodiments of the present disclosure, dielectric layers 38 are formed of low-k dielectric materials. The dielectric constants (k values) of the low-k dielectric materials may be lower than about 3.0, for example. Dielectric layers 38 may comprise a carbon-containing low-k dielectric material, Hydrogen SilsesQuioxane (HSQ), MethylSilsesQuioxane (MSQ), or the like. In accordance with some embodiments of the present disclosure, the formation of dielectric layers 38 includes depositing a porogen-containing dielectric material in the dielectric layers 38 and then performing a curing process to drive out the porogen, and hence the remaining dielectric layers 38 are porous.

The formation of metal lines 34 and vias 36 in dielectric layers 38 may include single damascene processes and/or dual damascene processes. In a single damascene process for forming a metal line or a via, a trench or a via opening is first formed in one of dielectric layers 38, followed by filling the trench or the via opening with a conductive material. A planarization process such as a CMP process is then performed to remove the excess portions of the conductive material higher than the top surface of the dielectric layer, leaving a metal line or a via in the corresponding trench or via opening. In a dual damascene process, both of a trench and a via opening are formed in a dielectric layer, with the via opening underlying and connected to the trench. Conductive materials are then filled into the trench and the via opening to form a metal line and a via, respectively. The conductive materials may include a diffusion barrier layer and a copper-containing metallic material over the diffusion barrier layer. The diffusion barrier layer may include titanium, titanium nitride, tantalum, tantalum nitride, or the like.

Metal lines 34 include top conductive (metal) features such as metal lines, metal pads (denoted as 34A) in a top dielectric layer (denoted as dielectric layer 38A), which is the top layer of dielectric layers 38. In accordance with some embodiments, dielectric layer 38A is formed of a low-k dielectric material similar to the material of lower ones of dielectric layers 38. In accordance with other embodiments, dielectric layer 38A is formed of a non-low-k dielectric material, which may include silicon nitride, Undoped Silicate Glass (USG), silicon oxide, or the like. Dielectric layer 38A may also have a multi-layer structure including, for example, two USG layers and a silicon nitride layer in between. Top metal features 34A may also be formed of copper or a copper alloy, and may have a dual damascene structure or a single damascene structure. Dielectric layer 38A is sometimes referred to as a top dielectric layer. The top dielectric layer 38A and the underlying dielectric layer 38 that is immediately underlying the top dielectric layer 38A may be formed as a single continuous dielectric layer, or may be formed as different dielectric layers using different processes, and/or formed of materials different from each other.

Figure 2:
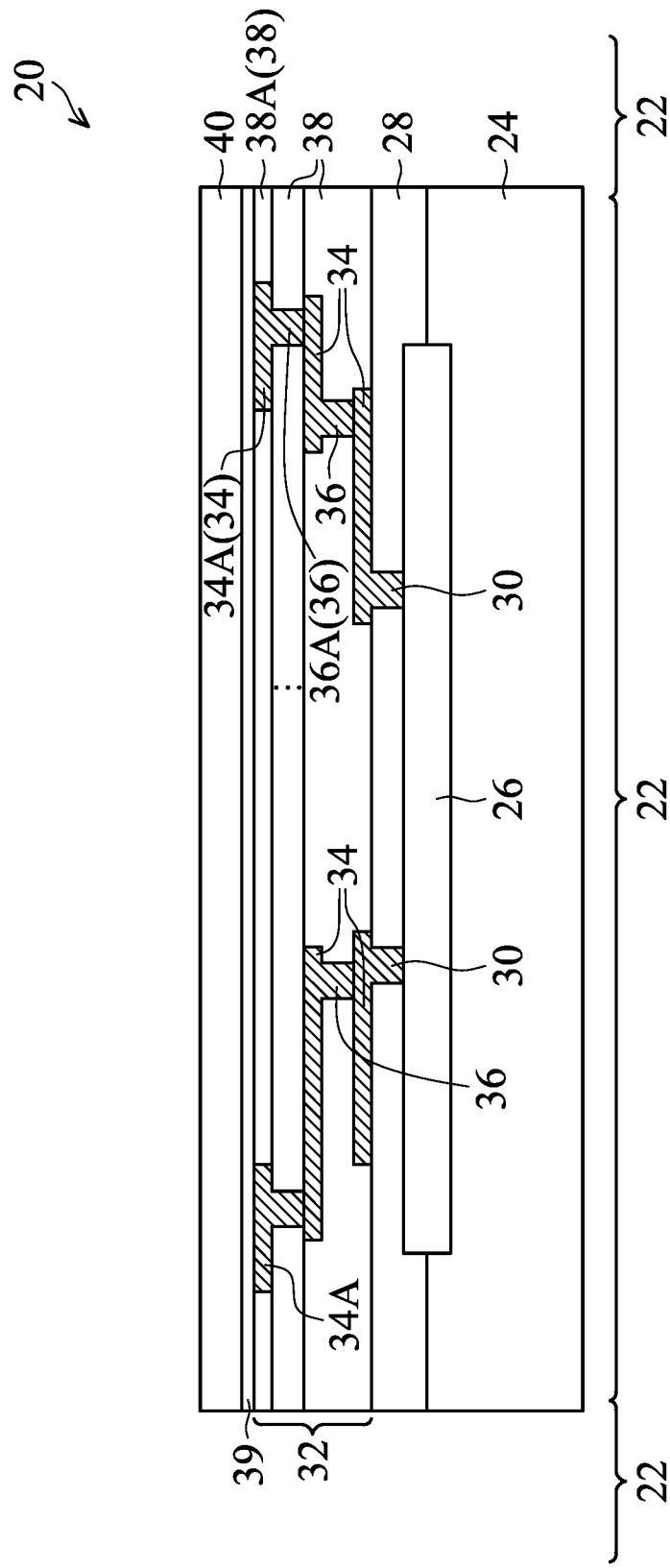

Referring to FIG. 2, a first etch stop layer 39 is deposited over interconnect structure 32. The respective process is illustrated as process 202 in the process flow 200 as shown in FIG. 16. In accordance some embodiments, the first etch stop layer 39 is formed of or comprises silicon carbide, silicon nitride, silicon carbo nitride, silicon oxycarbide, or the like. The deposition process may be performed using Atomic layer Deposition (ALD), Chemical Vapor Deposition (CVD), Plasma Enhanced Chemical Vapor Deposition (PECVD), or the like.

Passivation layer 40 (sometimes referred to as passivation-1 or pass-1) is formed over first etch stop layer 39. The respective process is illustrated as process 204 in the process flow 200 as shown in FIG. 16. In accordance with some embodiments, passivation layer 40 is formed of a non-low-k dielectric material having a dielectric constant equal to or greater than the dielectric constant of silicon oxide. Passivation layer 40 may be formed of or comprise an inorganic dielectric material, which may include a material selected from, and is not limited to, und-doped silicate glass, silicon oxide ($SiO_2$), silicon oxy-carbide ($SiOC_x$), silicon oxy-nitride ($SiON_x$), a carbon-containing low-k dielectric material, silicon nitride, or the like. The value "x" represents the relative atomic ratio. In accordance with some embodiments, the top surfaces of top dielectric layer 38A and metal lines 34A are coplanar. Accordingly, etch stop layer 39 and passivation layer 40 may be planar layers. In accordance with alternative embodiments, the top conductive features protrude higher than the top surface of the top dielectric layer 38A, and etch stop layer 39 and passivation layer 40 are non-planar.

Passivation layer 40 may be a low-k dielectric layer, and may be porous in accordance with some embodiments. For example, passivation layer 40 may be formed of or comprises the material as aforementioned, with pores being formed to reduce its k value. The porosity may be in the range between about 10 percent and about 30 percent. The formation of passivation layer 40 may include, and is not limited to, CVD, PECVD, or the like. In accordance with some embodiments, in the formation of passivation layer 40, porogen is incorporated, and then a curing process is performed to drive out the porogen, leaving the porous passivation layer 40.

Figure 3:
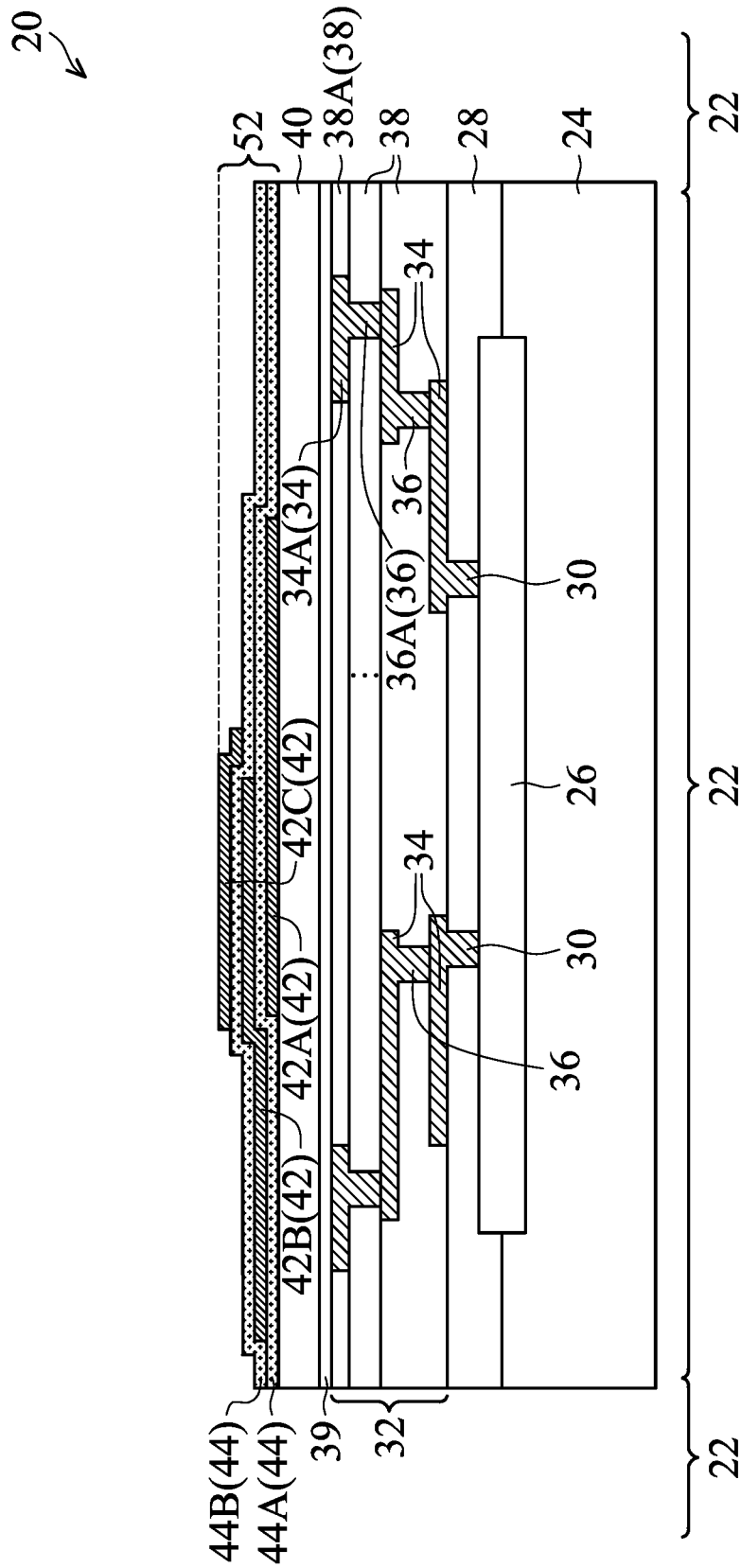

FIG. 3 illustrates capacitor 52 in accordance with some embodiments. The respective process is illustrated as process 206 in the process flow 200 as shown in FIG. 16. The capacitor 52 may be a MIM capacitor, which includes at least two, and possibly more, capacitor plates (electrodes) and the corresponding capacitor insulator(s) in between. In accordance with alternative embodiments, other types of capacitors such as Metal-Oxide-Metal (MOM) capacitors may be adopted. It is appreciated that capacitor 52 may be formed using different processes than discussed referring to FIG. 3, which processes are also contemplated by the present disclosure. Referring to FIG. 3, capacitor electrodes 42A, 42B, and 42C are formed, which are collectively and individually referred to as capacitor electrodes 42. Capacitor insulators 44A and 44B, which are collectively and individually referred to as capacitor insulators 44, are formed between capacitor electrodes 42. The formation of each of capacitor electrodes 42 and each of capacitor insulators 44 may include a deposition process, followed by a possible patterning process through etching to result in the shape and the size as desirable, for example, as shown in FIG. 3. The deposition of capacitor electrodes 42 and capacitor insulators 44 may be performed using the methods including, and not limited to, ALD, CVD, PECVD, and the like. Capacitor 52 may have a thickness in a range between about 400 Å and about 800 Å.

In accordance with some embodiments of the present disclosure, electrodes 42 are formed of or comprise a metal nitride such as titanium nitride (TiN). Capacitor electrodes 42 may have thicknesses in the range between about 300 Å and about 500 Å. In accordance with other embodiments, other metals, metal alloys, and metal nitrides such as tungsten, tungsten nitride (WN), etc. may be used.

In accordance with some embodiments of the present disclosure, each of capacitor insulators 44 is a single layer formed of a homogenous dielectric material such as zirconium oxide ($ZrO_2$). In accordance with other embodiments of the present disclosure, one or more of capacitor insulators 44 may be composite layers formed of stacked dielectric layers. For example, one of capacitor insulators 44 may be formed of a zirconium-containing dielectric layer (such as a $ZrO_2$ layer) and an aluminum-containing dielectric layer (such as an $Al_2O_3$ layer) over the zirconium-containing dielectric layer. Capacitor insulators 44 may also be formed of $ZrO_2/Al_2O_3/ZrO_2$ (ZAZ), which includes a first $ZrO_2$ layer, an $Al_2O_3$ layer over the first $ZrO_2$ layer, and a second $ZrO_2$ layer over the $Al_2O_3$ layer. ZAZ has the advantageous feature of having a low equivalent oxide thickness, and hence the capacitance value of the resulting capacitor is high. The thicknesses of capacitor insulators 44 may be in the range between about 0.1 µm and about 0.5 µm.

Figure 4:
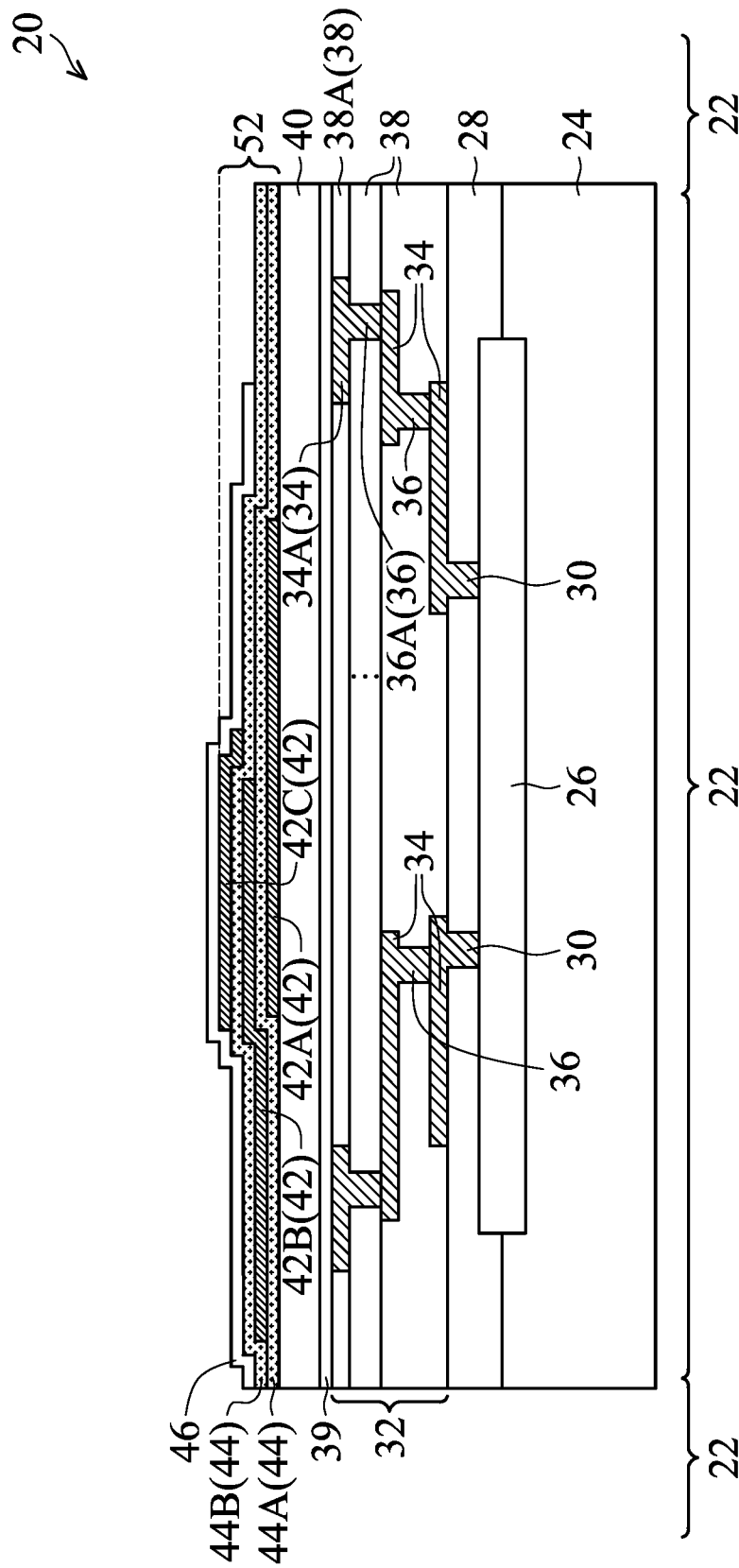

FIG. 4 illustrates the formation of a second etch stop layer 46. The respective process is illustrated as process 208 in the process flow 200 as shown in FIG. 16. In accordance some embodiments, the second etch stop layer 46 is formed of a same material as first etch stop layer 39. The material of etch stop layer 46 may also be different from, but similar to, etch stop layer 39, so that in a subsequent etching process, these two etch stop layers may be etched in a same etching process using a same etching chemical/process gas. In accordance with some embodiments, etch stop layer 46 is formed of or comprises silicon carbide, silicon nitride, silicon carbo nitride, silicon oxycarbide, or the like. The formation may be performed using ALD, CVD, PECVD, or the like. In accordance with some embodiments, etch stop layer 46 is patterned in an etching process, so that it covers capacitor 52, while some other portions of etch stop layer 46 is removed. For example, the portion of etch stop layer 46 directly over a portion of metal pad 34A may be removed.

Figure 5:
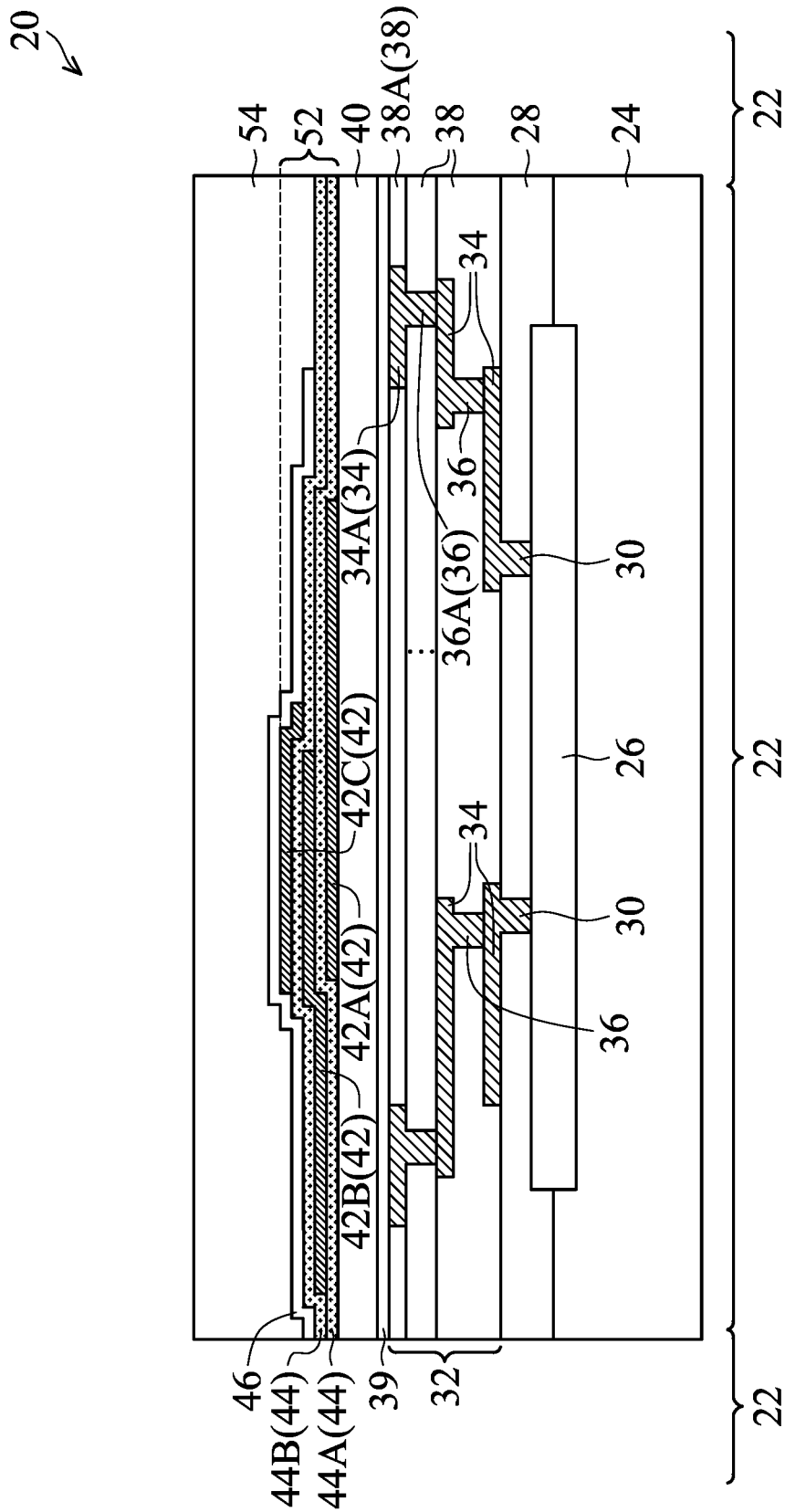

As shown in FIG. 5, passivation layer 54 (sometimes referred to as passivation-2 or pass-2) is formed over interconnect structure 32. The respective process is illustrated as process 210 in the process flow 200 as shown in FIG. 16. In accordance with some embodiments, passivation layer 54 is formed of or comprises an inorganic dielectric material, which may include a material selected from, and is not limited to, undoped silicate glass, silicon oxide, silicon oxy-carbide, silicon oxy-nitride, or the like. The materials of passivation layers 40 and 54 may be the same as each other. In accordance with alternative embodiments, the materials of passivation layers 40 and 54 are different from each other, but are also similar to each other. For example, in the embodiments in which both of passivation layers 40 and 54 are formed of silicon oxycarbide, the atomic percentages of silicon, oxygen, and carbon in passivation layers 40 and 54 may have differences, which are smaller than about 5 percent.

In accordance with some embodiments, passivation layers 40 and 54 are formed of a same material, while passivation layer 40 has a greater porosity than passivation layer 54. For example, assuming passivation layer 40 has porosity value PRV40, and passivation layer 54 has porosity value PRV54, wherein the porosity values are expressed as percentages. The difference (PRV40–PRV54) may be greater than about 10%, and may be in the range between about 10 percent and about 30 percent. With a higher porosity, the k value of passivation layer 40 is also lower than the k value of passivation layer 54. For example, the k value of passivation layer 40 may be in the range between about 3.0 and about 4.0, while the k value of passivation layer 54 may be in the range between about 3.8 and about 5.0. Making passivation layers 40 and 54 to have the same or similar material, but with passivation layer 40 having a greater porosity is advantageous in subsequent etching processes, in which passivation layer 40 is etched faster than passivation layer 54. In accordance with alternative embodiments, passivation layers 40 and 54 are formed of different materials.

Figure 6:
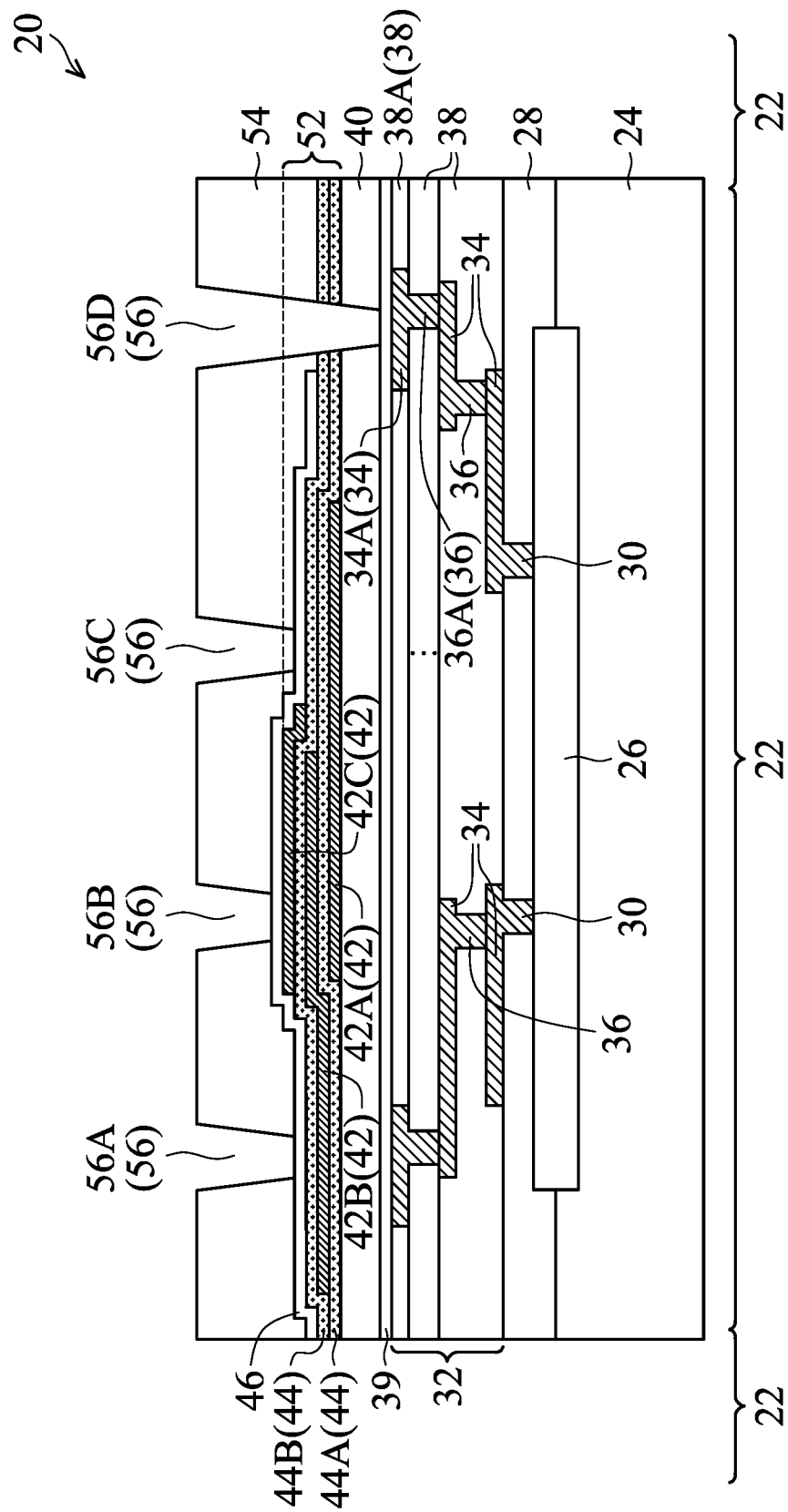

Referring to FIG. 6, passivation layers 54 and 40 are patterned in an etching process to form openings 56, which includes 56A, 56B, 56C, and 56D. The respective process is illustrated as process 212 in the process flow 200 as shown in FIG. 16. The etching process may include a dry etching process, which includes forming a patterned etching mask(s) (not shown) such as a patterned photo resist, and then etching passivation layers 54 and 40. In the formation of opening 56D, the capacitor insulators 44 are also etched-through, if they are exposed to openings 56. The patterned etching masks are then removed. The etching is performed using an anisotropic dry etching process, with an etching gas used as the etching chemical. The etching process is stopped on etch stop layers 39 and 46. Accordingly, forming etch stop layers 39 and 46 making it easy for selecting the etching gas, which attacks passivation layers 54 and 40 and capacitor insulators 44, but does not attack etch stop layers 39 and 46. It is appreciated that since opening 56D is deeper than openings 56A, 56B, and 56C, and an extra passivation layer 40 needs to be etched, it is advantageous to make passivation layer 40 to be porous (with a low-k value), so that when passivation layer 40 is exposed, the etching rate is increased, and hence the loading effect in the formation of openings 56 is reduced. Alternatively, passivation layer 40 (formed of a low-k dielectric material) is formed of a material different from that of passivation layer 54, and has a higher etching rate than passivation layer 54. For example, a ratio ER40/ER54 may be greater than about 1.5 or greater than about 2.0, and may be in the range between about 1.5 and about 5.0, wherein etching rate ER54 is the etching rate of passivation layer 54, and etching rate ER40 is the etching rate of passivation layer 40.

Figure 7:
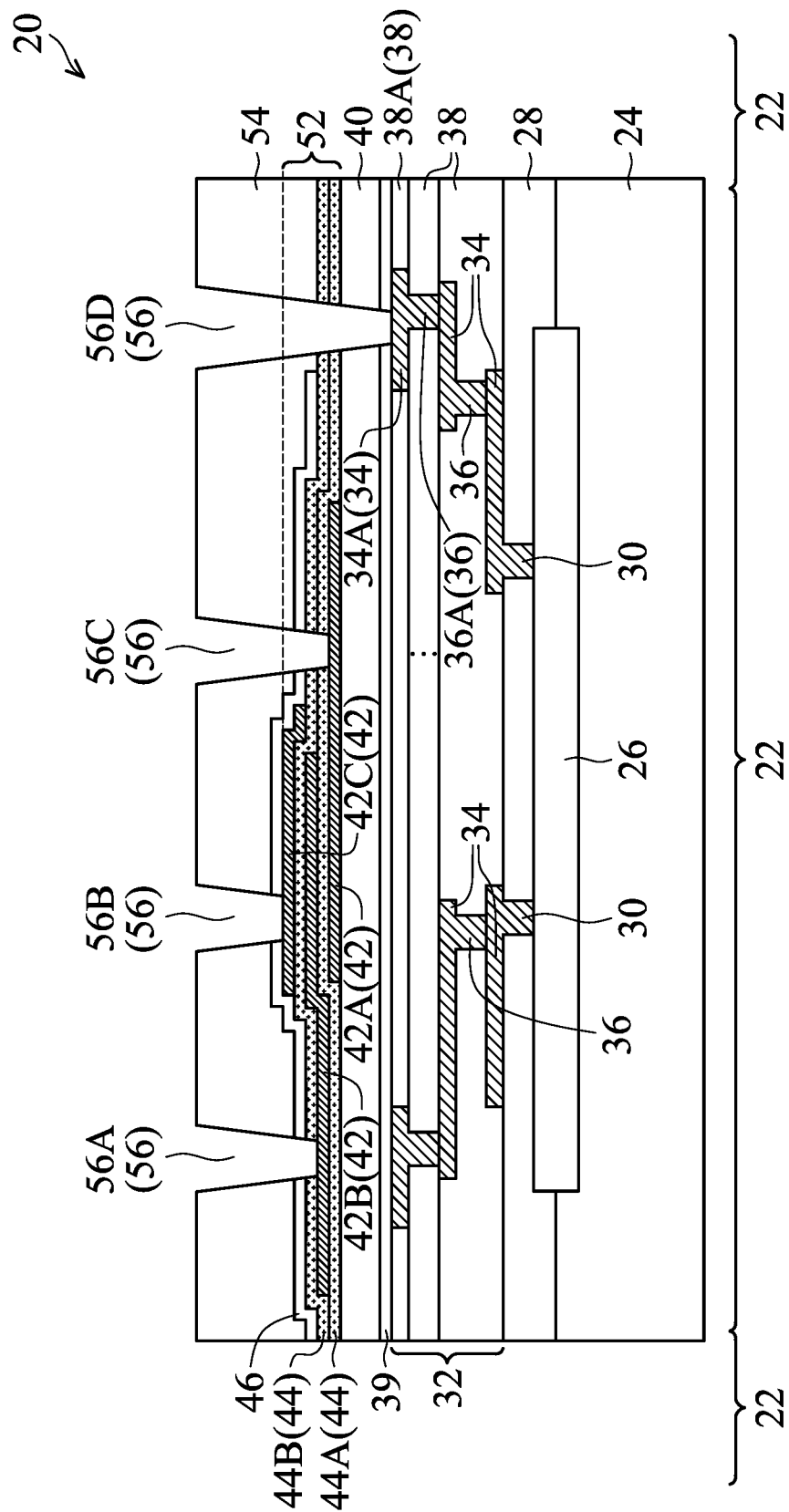

Referring to FIG. 7, etch stop layers 39 and 46 are etched-through, so that the underlying capacitor electrodes 42A, 42B, and 42C and metal pad 34A are exposed. Opening 56A also penetrates through capacitor insulator 44B, and opening 56C also penetrates through both of capacitor insulators 44A and 44B. The etching process is performed using capacitor electrodes 42A, 42B, and 42C as etch stop layers. The etching of etch stop layers 39 and 46 may be performed using a wet etching process or a dry etching process, and the etching process may be isotropic or anisotropic.

Figure 8:
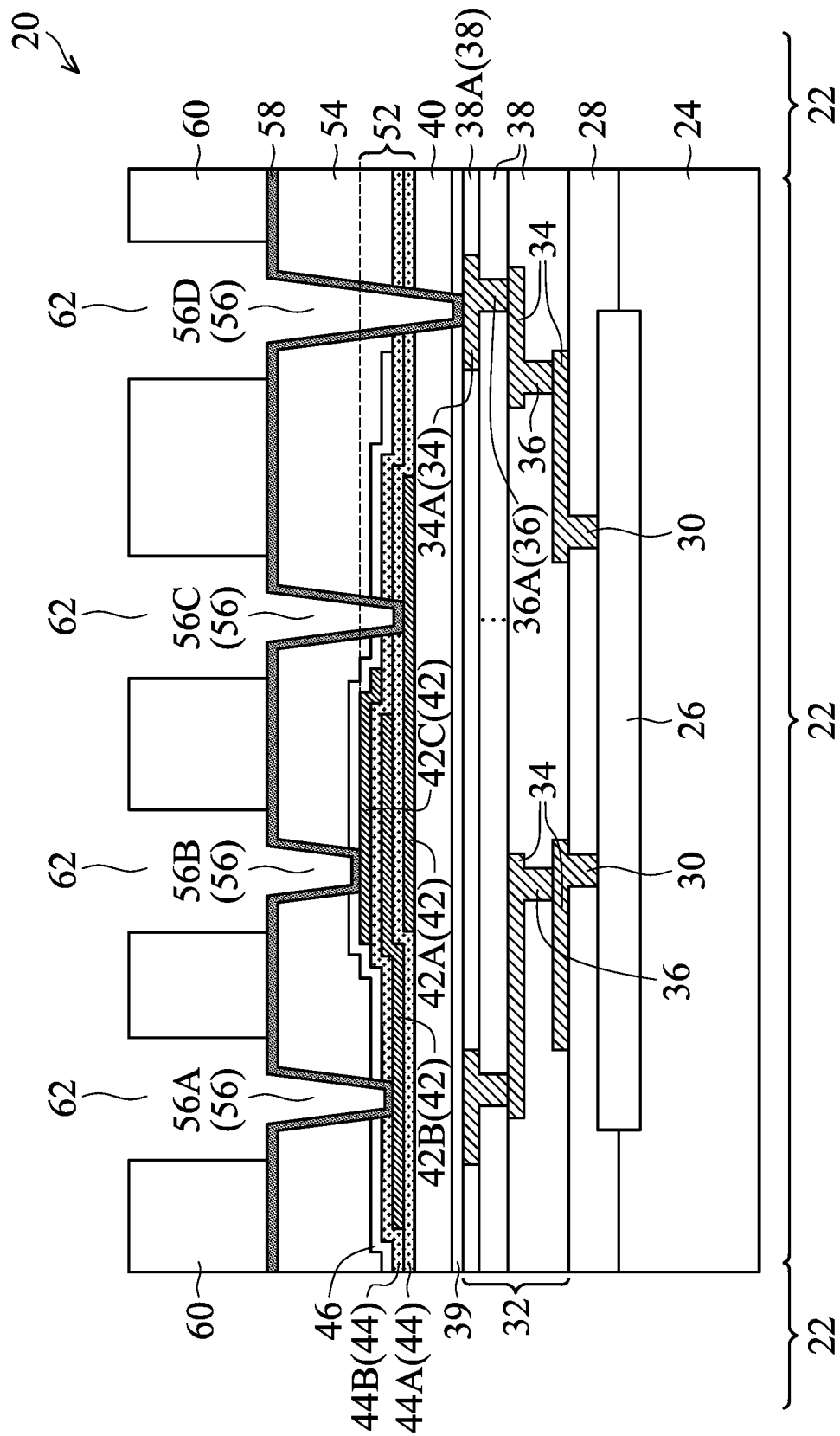

FIG. 8 illustrates the deposition of metal seed layer 58. The respective process is illustrated as process 214 in the process flow 200 as shown in FIG. 16. In accordance with some embodiments, metal seed layer 58 comprises a titanium layer and a copper layer over the titanium layer. In accordance with alternative embodiments, metal seed layer 58 comprises a copper layer in contact with passivation layer 40. The deposition process may be performed using Physical Vapor Deposition (PVD), CVD, Metal Organic Chemical Vapor Deposition (MOCVD), or the like.

FIG. 8 further illustrates the formation of patterned plating mask 60. The respective process is illustrated as process 216 in the process flow 200 as shown in FIG. 16. In accordance with some embodiments, plating mask 60 is formed of photo resist, and hence is alternatively referred to as photo resist 60. Openings 62 are formed in the patterned plating mask 60 to reveal metal seed layer 58. Openings 62 may have widths in a range between about 1 μm and about 3 μm.

Figure 9:
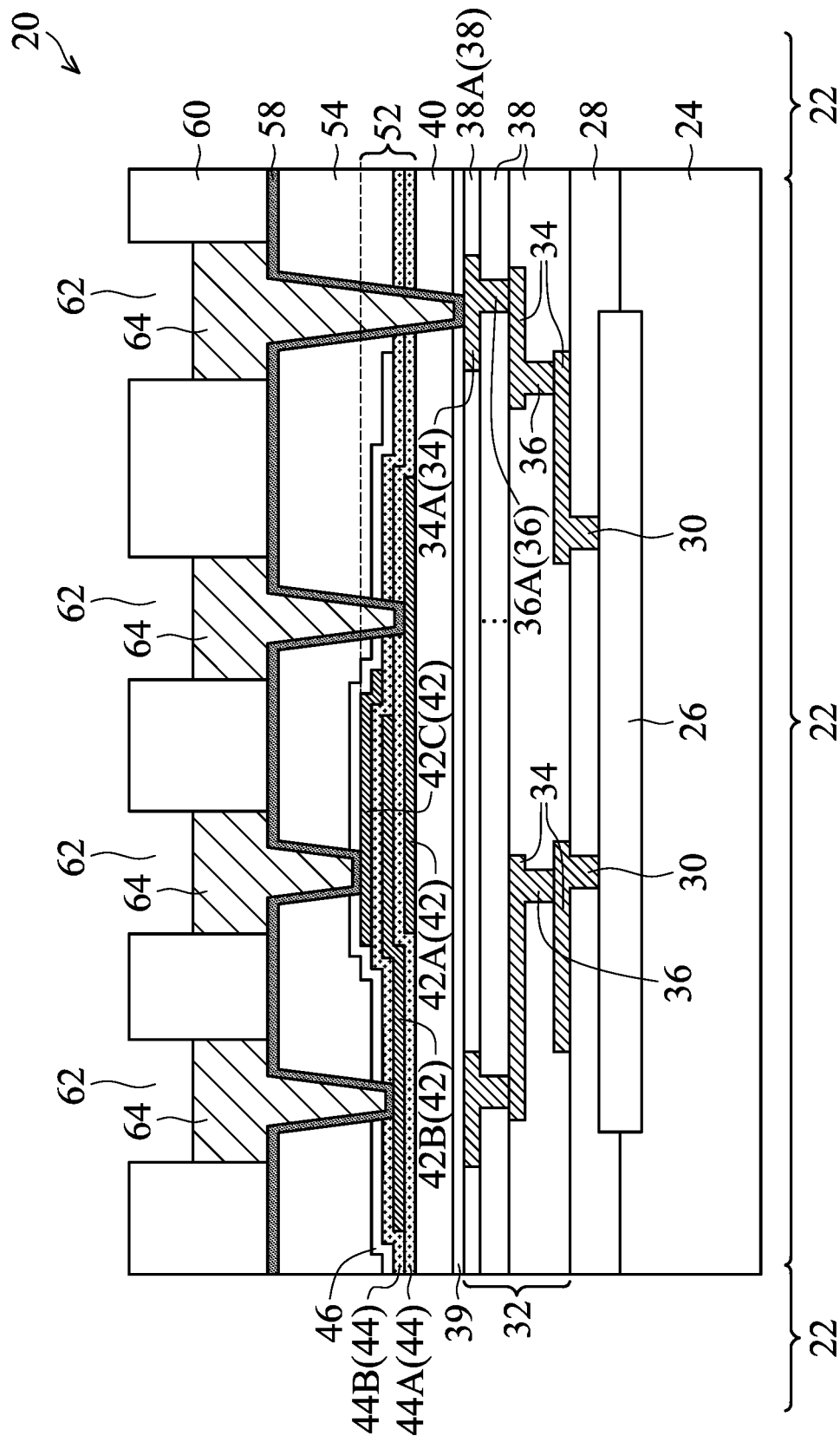

FIG. 9 illustrates the plating of conductive material (features) 64 into openings 62 and on metal seed layer 58. The respective process is illustrated as process 218 in the process flow 200 as shown in FIG. 16. In accordance with some embodiments of the present disclosure, the formation of conductive features 64 includes a plating process, which may include an electrochemical plating process, an electroless plating process, or the like. The plating is performed in a plating chemical solution. Conductive features 64 may include copper, aluminum, nickel, tungsten, or the like, or alloys thereof. In accordance with some embodiments, conductive features 64 comprise copper, and are free from aluminum.

Figure 10:
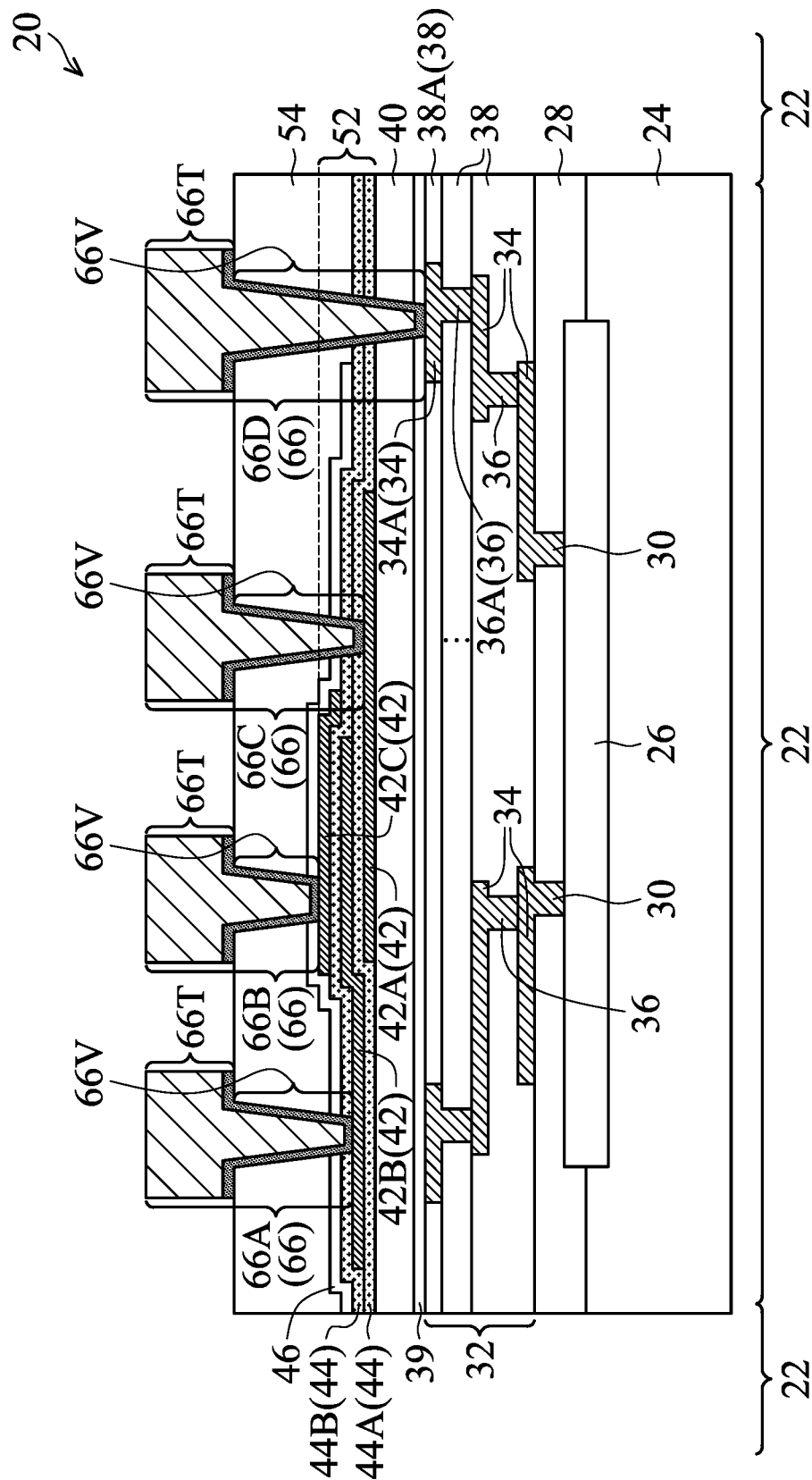

Next, photo resist (plating mask) 60 as shown in FIG. 9 is removed. The respective process is illustrated as process 220 in the process flow 200 as shown in FIG. 16. In a subsequent process, an etching process is performed to remove the portions of metal seed layer 58 that are not protected by the overlying conductive features 64. The resulting structure is also shown in FIG. 10. The respective process is illustrated as process 222 in the process flow 200 as shown in FIG. 16. Throughout the description, conductive features 64 and the corresponding underlying metal seed layer 58 are collectively referred to Redistribution Lines (RDLs) 66, which include RDLs 66A, 66B, 66C, and 66D. Each of RDLs 66 may include a via portion 66V extending into passivation layer 40, and a trace/line portion 66T over passivation layer 54. RDLs 66A, 66B, and 66C are electrically connected to capacitor electrodes 42. RDL 66D may be electrically connected to conductive feature 34A. Vias 66V in RDLs 66A, 66B, and 66D are in contact with capacitor electrodes 42 through top contacting rather than edge contacting as in conventional connection schemes. The contact resistance is thus reduced.

Figure 11:
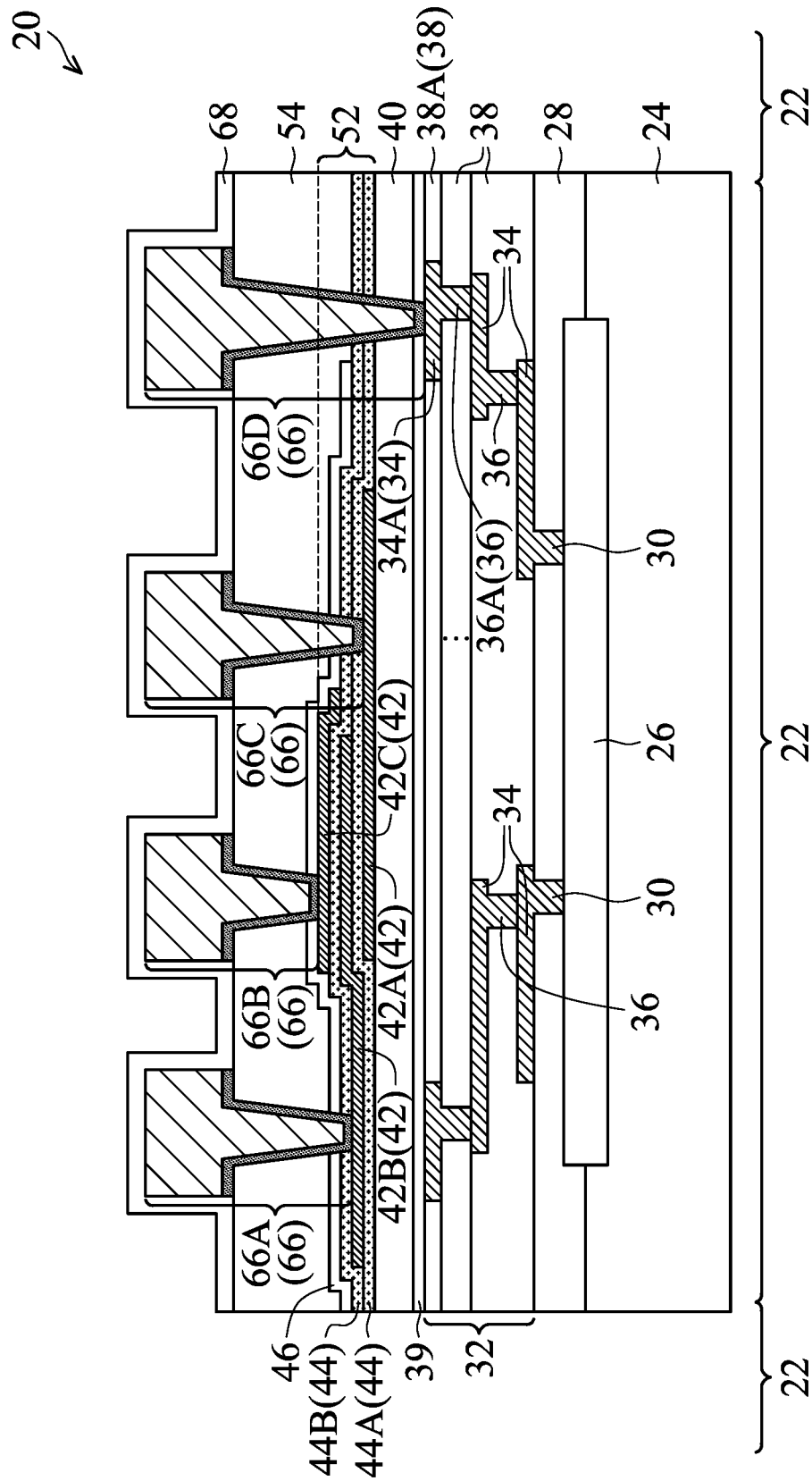

Referring to FIG. 11, passivation layer 68 is deposited. The respective process is illustrated as process 224 in the process flow 200 as shown in FIG. 16. Passivation layer 68 (sometimes referred to as passivation-3 or pass-3) is formed as a blanket layer. In accordance with some embodiments, passivation layer 68 is formed of or comprises an inorganic dielectric material, which may include, and is not limited to, silicon nitride, silicon oxide, silicon oxy-nitride, silicon oxy-carbide, silicon carbide, or the like, combinations thereof, or multi-layers thereof. The deposition may be performed through a conformal deposition process such as Atomic Layer Deposition (ALD), CVD, or the like. Accordingly, the vertical portions and horizontal portions of passivation layer 68 have the same thickness or substantially the same thickness, for example, with a variation smaller than about 20 percent or smaller than about 10 percent. Passivation layer 68 may be formed of a material the same as or different from the material of passivation layer 54. Passivation layer 68 may be formed of a material the same as or different from the material of passivation layer 40, except passivation layer 68 may have a porosity lower than passivation layer 40. Accordingly, the k value and the porosity of passivation layer 68 may be similar to that of passivation layer 54.

Figure 12:
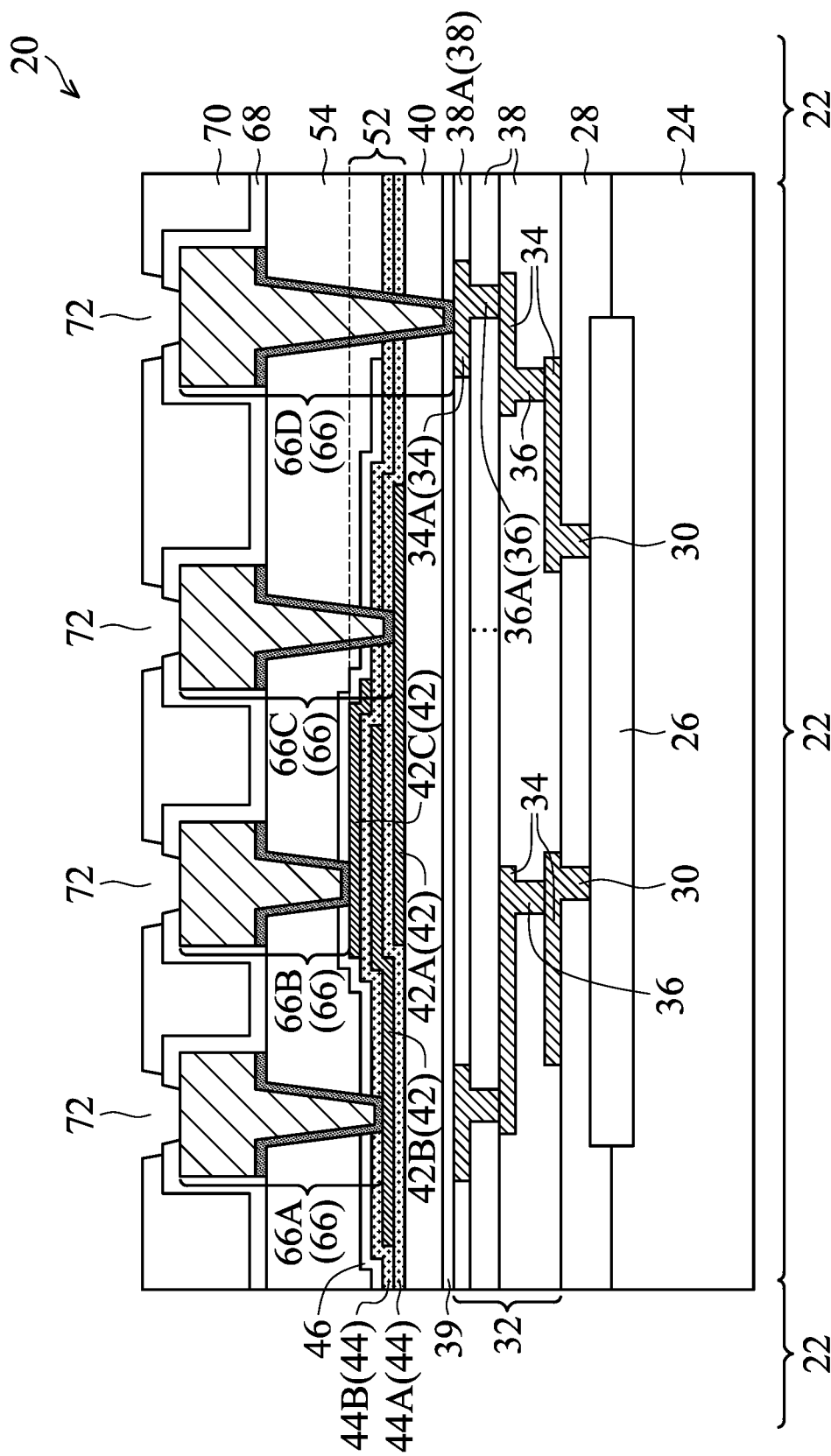

Referring to FIG. 12, planarization layer 70 is deposited, and is then patterned to form openings 72. The respective process is illustrated as process 226 in the process flow 200 as shown in FIG. 16. Planarization layer 70 may be formed of a polymer. The polymer may be photo sensitive or non-photo-sensitive. The photo-sensitive polymer for forming planarization layer 70 may comprise polyimide, polybenzoxazole (PBO), or the like. The patterning of planarization layer 70, when it is photo sensitive, may include performing a photo-exposure process on the planarization layer 70, and then developing planarization layer 70 to form openings 72. In accordance with alternative embodiments in which planarization layer 70 is non-photo-sensitive, for example, when planarization layer 70 comprises a non-photo-sensitive epoxy/polymer, the patterning of planarization layer 70 may include applying and patterning a photo resist over the planarization layer 70, and etching the planarization layer 70 using the patterned photo resist to define patterns of openings.

Further referring to FIG. 12, an etching process is performed to etch-through passivation layer 68, so that openings 72 further penetrate through passivation layer 68. The respective process is also illustrated as process 228 in the process flow 200 as shown in FIG. 16. It is appreciated that the etching of passivation layer 68 may be performed before or after the etching of planarization layer 70.

Figure 13:
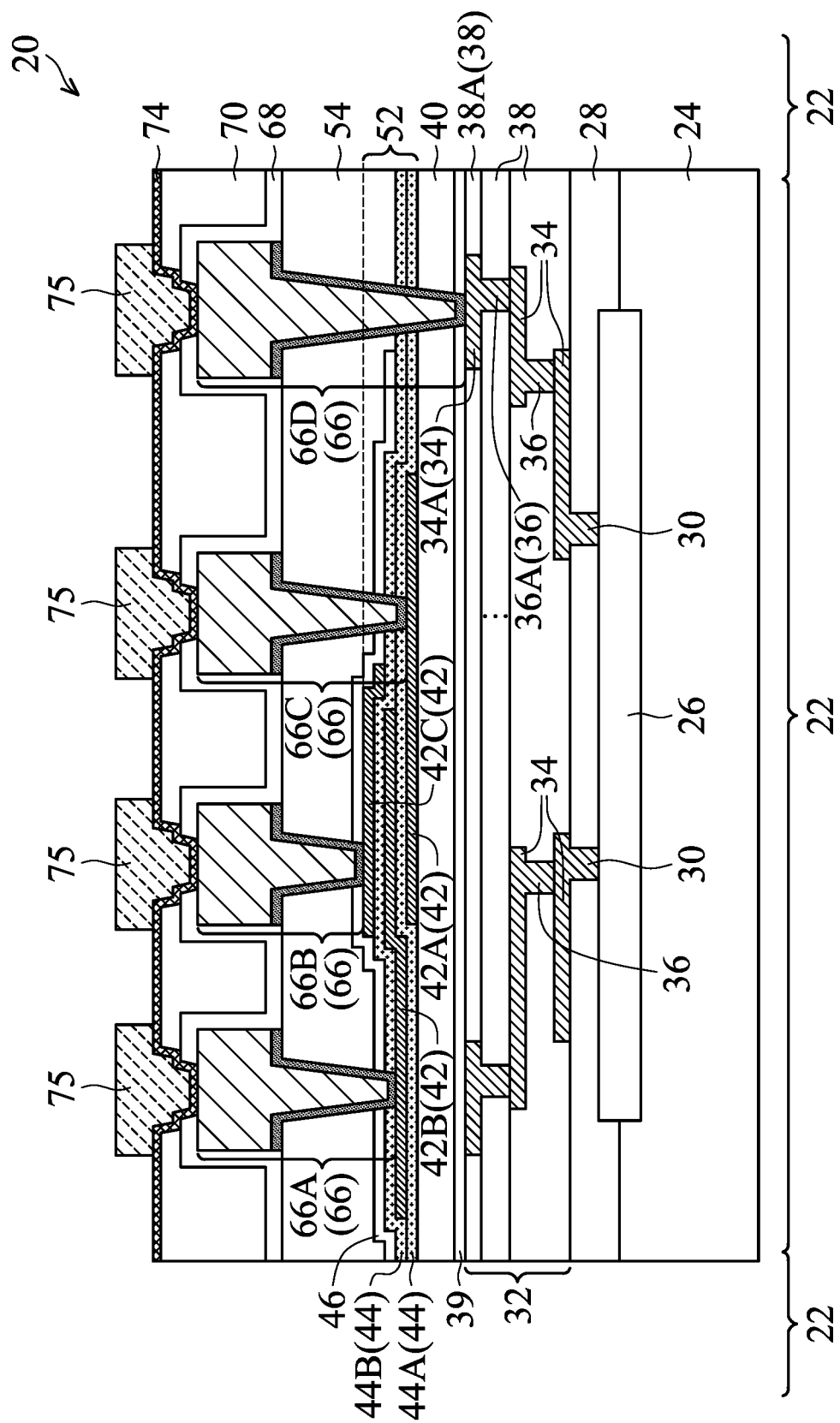

FIG. 13 illustrates the deposition of metal seed layer 74. The respective process is illustrated as process 230 in the process flow 200 as shown in FIG. 16. In accordance with some embodiments, metal seed layer 74 includes a titanium layer and a copper layer over the titanium layer. In accordance with alternative embodiments, metal seed layer 74 comprises a copper layer in contact with planarization layer 70, passivation layer 68, and RDLs 66A, 66B, 66C, and 66D.

Next, conductive regions 75 are plated. The respective process is illustrated as process 232 in the process flow 200 as shown in FIG. 16. The process for plating conductive regions 75 may include forming a patterned plating mask (for example, a photo resist, not shown), and plating conductive regions 75 in the openings in the plating mask. Conductive regions 75 may comprise copper, nickel, palladium, aluminum, alloys thereof, and/or multi-layers thereof. The patterned plating mask is then removed.

Figure 14:
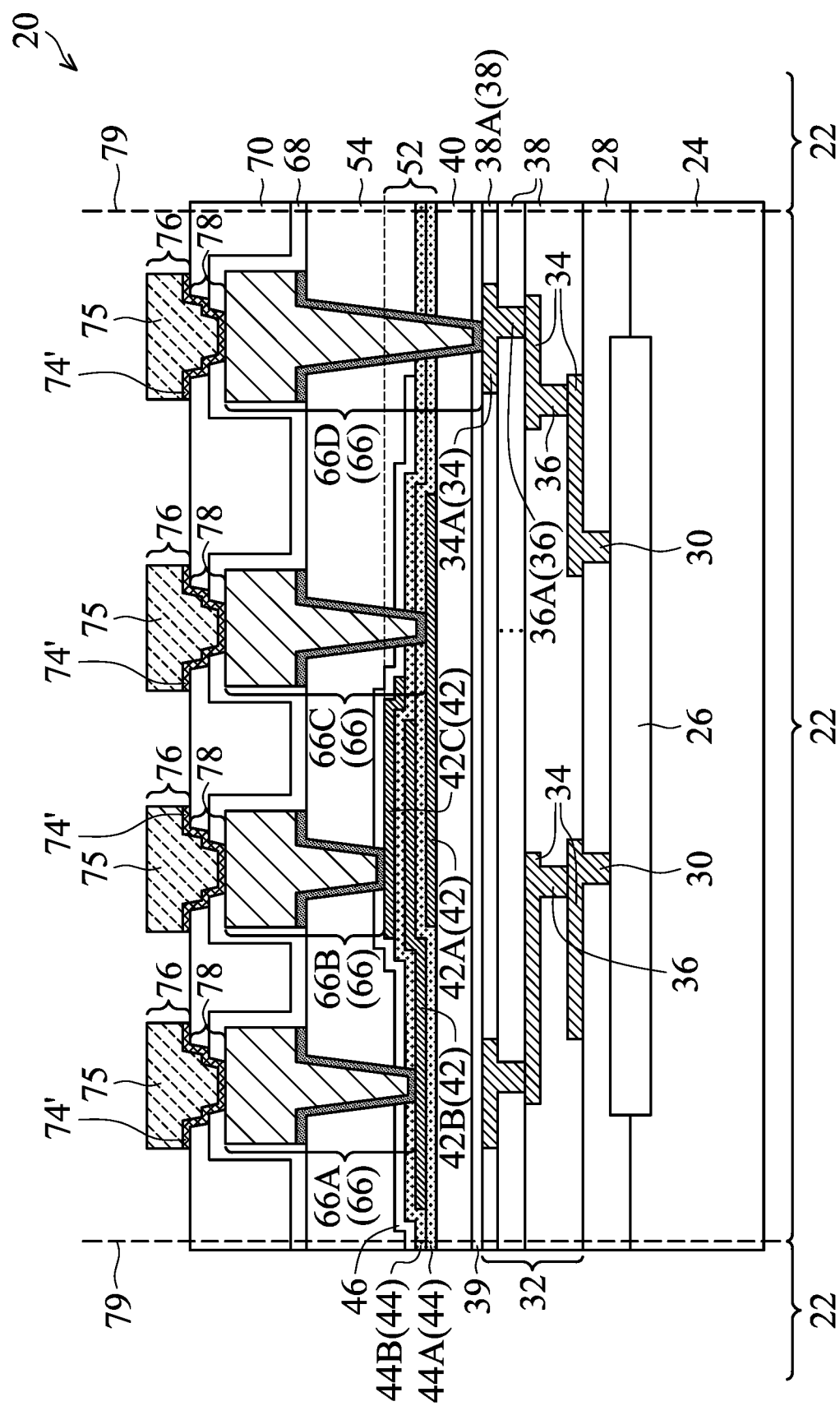

Metal seed layer 74 is then etched, and the portions of metal seed layer 74 that are exposed after the removal of the plating mask are removed, while the portions of metal seed layer 74 directly underlying conductive regions 75 are left. The respective process is illustrated as process 234 in the process flow 200 as shown in FIG. 16. The resulting structure is shown in FIG. 14. The remaining portions of metal seed layer 74 are Under-Bump Metallurgies (UBMs) 74'. UBMs 74' and conductive regions 75 in combination form vias 78 and electrical connectors 76 (which are also referred to as conductive bumps or metal bumps).

In a subsequent process, wafer 20 is singulated, for example, sawed along scribe lines 79 to form individual device dies 22. The respective process is illustrated as process 236 in the process flow 200 as shown in FIG. 16. Device dies 22 are also referred to as devices 22 or package components 22 since devices 22 may be used for bonding to other package components in order to form packages. As aforementioned, devices 22 may be device dies, interposers, package substrate, packages, or the like.

Figure 15:
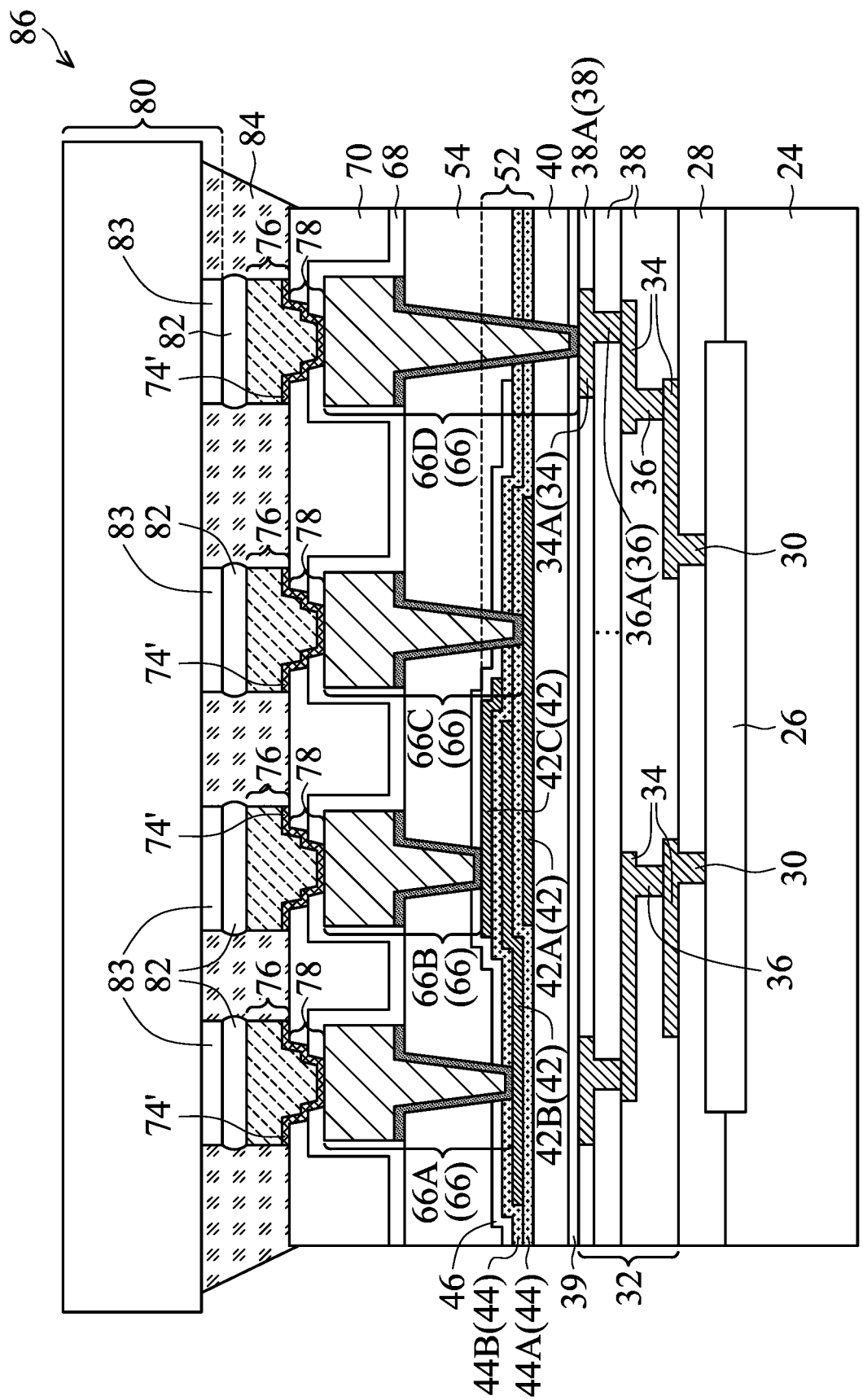
Figure 16:
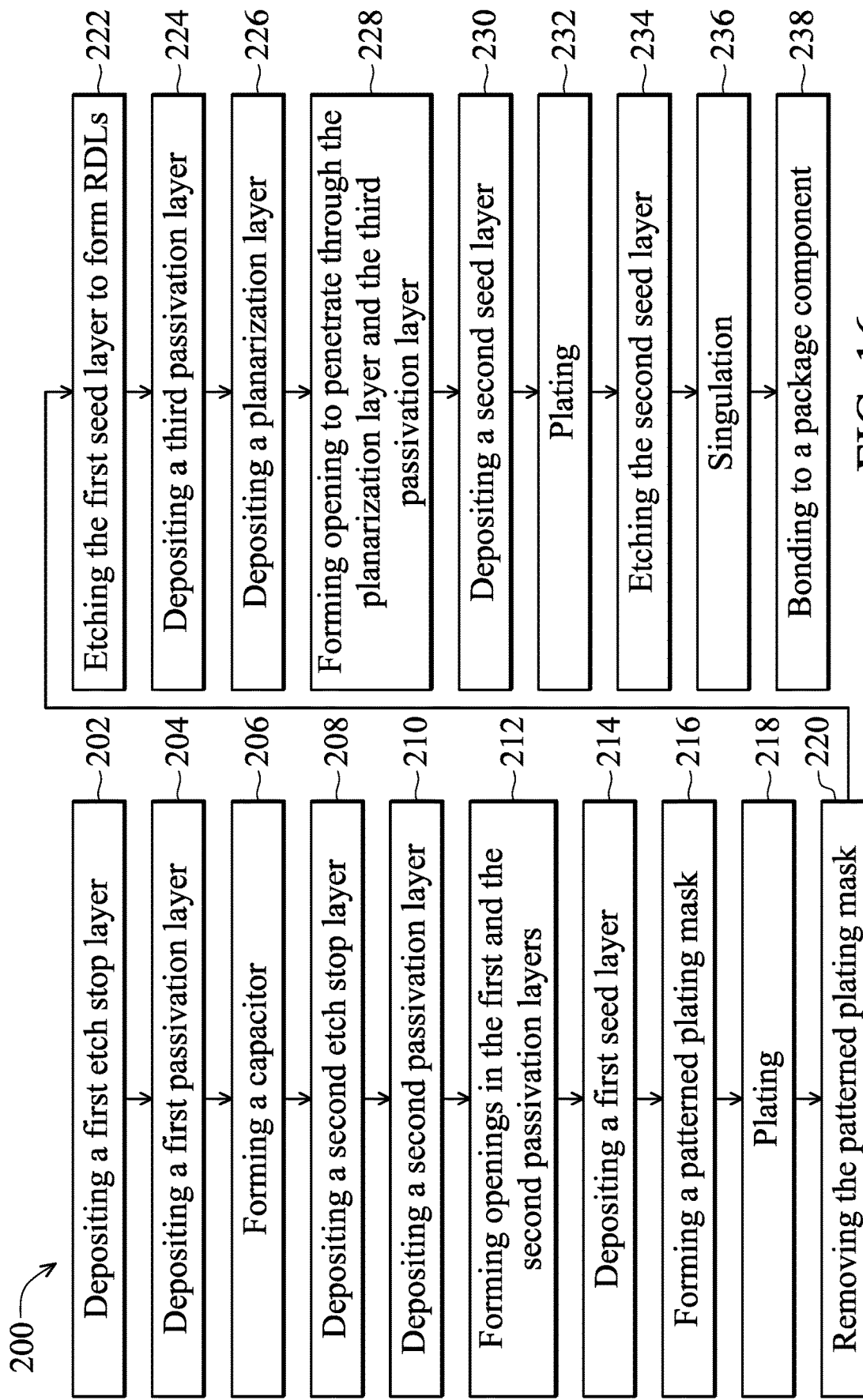
FIG. 16 illustrates a process flow for forming a device in accordance with some embodiments.

Referring to FIG. 15, device 22 is bonded with package component 80 to form package 86. The respective process is illustrated as process 238 in the process flow 200 as shown in FIG. 16. In accordance with some embodiments, package component 80 is or comprises an interposer, a package substrate, a printed circuit board, a package, or the like. Electrical connectors 83 in package component 80 may be bonded to package component 80 through solder regions 82. Underfill 84 is dispensed between device 22 and package component 80. In accordance with some embodiments, power supply potentials such as VDD and VSS (ground) may be provided to the capacitor 52. For example, RDL 66A may be connected to electrical ground, and RDLs 66B and 66C may be connected to VDD, and hence capacitor electrodes 42A and 42C are interconnected. RDL 66D may be used by logic circuits, and may be provided with a logic signal.

The embodiments of the present disclosure have some advantageous features. The vias connecting to the capacitor plates are in contact with the top surfaces of capacitor electrodes, hence the contact resistance is lower than when edge contacts are used. Furthermore, by forming the passivation layer underlying the capacitor using a lower-k material than the passivation layer over the capacitor, the loading effect in the etching of passivation layers is reduced. Accordingly, an integrated process for forming contacts to the capacitor and the underlying metal pads is provided, with the integrated process having reduced loading effect.

In accordance with some embodiments of the present disclosure, a method includes depositing a first passivation layer over a conductive feature, wherein the first passivation layer has a first dielectric constant; forming a capacitor over the first passivation layer; depositing a second passivation layer over the capacitor, wherein the second passivation layer has a second dielectric constant greater than the first dielectric constant; forming a redistribution line over and electrically connecting to the capacitor; depositing a third passivation layer over the redistribution line; and forming an Under-Bump-Metallurgy (UBM) penetrating through the third passivation layer to electrically connect to the redistribution line. In an embodiment, the depositing the second passivation layer comprises depositing a same material as the first passivation layer, with more porogen incorporated in to the first passivation layer than the second passivation layer. In an embodiment, the forming the capacitor comprises forming a metal-insulator-metal capacitor. In an embodiment, the method further includes, before the first passivation layer is formed, depositing a first etch stop layer; after the capacitor is formed and before the second passivation layer is deposited, depositing a second etch stop layer; and performing an etching process to etch-through the second passivation layer to form a first opening stopping on a first top surface of the second etch stop layer, and to etch-through the second passivation layer and the first passivation layer to form a second opening stopping on a top surface of the first etch stop layer. In an embodiment, the first opening and the second opening are formed in a same etching process. In an embodiment, the method further includes, in a common process, etching-through the first etch stop layer and the second etch stop layer. In an embodiment, the first etch stop layer and the second etch stop layer are deposited using a same dielectric material. In an embodiment, the first passivation layer is a low-k dielectric layer, and the second passivation layer is a non-low-k dielectric layer.

In accordance with some embodiments of the present disclosure, a device includes a conductive pad; a first passivation layer over the conductive pad, wherein the first passivation layer comprises a first dielectric material, and the first passivation layer has a first dielectric constant; a second passivation layer over the first passivation layer, wherein the second passivation layer has a second dielectric constant higher than the first dielectric constant; a capacitor sandwiched between the first passivation layer and the second passivation layer; a third passivation layer over the second passivation layer; a first redistribution line penetrating through the second passivation layer to contact a top surface of a capacitor electrode of the capacitor; and a second redistribution line penetrating through both of the second passivation layer and the first passivation layer to contact the conductive pad. In an embodiment, the first passivation layer has a higher porosity than the second passivation layer. In an embodiment, the first passivation layer is a low-k passivation layer, and the second passivation layer is a non-low-k passivation layer. In an embodiment, each of the first redistribution line and the second redistribution line comprises a trace portion sandwiched between the second passivation layer and the third passivation layer; and a via portion extending into the second passivation layer. In an embodiment, the device further includes, a first etch stop layer underlying and contacting the first passivation layer; and a second etch stop layer between, and contacting both of, the capacitor and the second passivation layer. In an embodiment, the first redistribution line penetrates through the second etch stop layer, and wherein the second redistribution line penetrates through the first etch stop layer. In an embodiment, the first and the second etch stop layer are formed of a same material.

In accordance with some embodiments of the present disclosure, a device includes a conductive feature; a first etch stop layer over and contacting the conductive feature; a first passivation layer over the first etch stop layer, wherein the first passivation layer has a first porosity value; a capacitor over the first passivation layer; a second etch stop layer over the capacitor; a second passivation layer over the second etch stop layer, wherein the second passivation layer has a second porosity value lower than the first porosity value; a first redistribution line penetrating through the second passivation layer and the second etch stop layer to electrically connect to the capacitor; and a second redistribution line penetrating through the second passivation layer, the first passivation layer, and the first etch stop layer to electrically connect to the conductive feature. In an embodiment, the first redistribution line is in contact with the second etch stop layer, and is vertically spaced apart from the first etch stop layer. In an embodiment, the second redistribution line is in contact with the first etch stop layer, and is laterally spaced apart from the second etch stop layer. In an embodiment, the first passivation layer and the second passivation layer are formed of a same dielectric material, with the first passivation layer having a lower dielectric constant than the second passivation layer. In an embodiment, the second etch stop layer has a bottom surface forming an interface with a top surface of a capacitor electrode of the capacitor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a metal pad;
   a first etch stop layer over the metal pad;
   a first passivation layer over and contacting the first etch stop layer;
   a capacitor over the first passivation layer, the capacitor comprising a capacitor electrode and a capacitor insulator over and contacting the capacitor electrode;
   a second passivation layer over the first passivation layer, wherein the first passivation layer is more porous than the second passivation layer;
   a first redistribution line comprising:
      a first via extending from a top surface of the second passivation layer to a first top surface of the metal pad; and
      a first metal line over and joined to the first via; and
   a second redistribution line comprising:
      a second via extending from the top surface of the second passivation layer to a second top surface of the capacitor electrode; and
      a second metal line over and joined to the second via.

2. The device of claim 1, wherein the second passivation layer and the first passivation layer are formed of a same dielectric material.

3. The device of claim 2, wherein the first passivation layer is a low-k dielectric layer, and the second passivation layer is a non-low-k dielectric layer.

4. The device of claim 1, wherein the capacitor comprises a metal-insulator-metal capacitor.

5. The device of claim 1 further comprises:
   a second etch stop layer overlying the capacitor and underlying the second passivation layer, wherein the second via penetrates through the second etch stop layer.

6. The device of claim 5 wherein the first etch stop layer and the second etch stop layer comprise a same dielectric material, and wherein the second etch stop layer is spaced apart from the first via, and has an edge in contact with the second via.

7. The device of claim 1, wherein the capacitor electrode is over and in physical contact with the first passivation layer.

8. The device of claim 1, wherein the first passivation layer is thicker than the second passivation layer.

9. A device comprising:
   a conductive pad;
   a first passivation layer over the conductive pad, wherein the first passivation layer comprises a first dielectric material, and the first passivation layer has a first dielectric constant;
   a second passivation layer over the first passivation layer, wherein the second passivation layer has a second dielectric constant higher than the first dielectric constant, wherein the first passivation layer comprises a same dielectric material as the second passivation layer, and wherein the first passivation layer has a higher porosity value than the second passivation layer;
   a capacitor sandwiched between the first passivation layer and the second passivation layer;
   a third passivation layer over the second passivation layer;
   a first redistribution line penetrating through the second passivation layer to contact a top surface of a capacitor electrode of the capacitor; and
   a second redistribution line penetrating through both of the second passivation layer and the first passivation layer to contact the conductive pad.

10. The device of claim 9, wherein the first passivation layer comprises silicon oxy-carbide.

11. The device of claim 9, wherein the first passivation layer is a low-k passivation layer, and the second passivation layer is a non-low-k passivation layer.

12. The device of claim 9, wherein each of the first redistribution line and the second redistribution line comprises:
   a trace portion sandwiched between the second passivation layer and the third passivation layer; and
   a via portion extending into the second passivation layer.

13. The device of claim 9 further comprising:
   a first etch stop layer underlying and contacting the first passivation layer; and
   a second etch stop layer between, and contacting both of, the capacitor and the second passivation layer.

14. The device of claim 13, wherein the first redistribution line penetrates through the second etch stop layer, and wherein the second redistribution line penetrates through the first etch stop layer.

15. The device of claim 13, wherein the first and the second etch stop layer are formed of a same material.

16. A device comprising:
a conductive feature;
a first etch stop layer over and contacting the conductive feature;
a first passivation layer over the first etch stop layer, wherein the first passivation layer has a first porosity value;
a capacitor over the first passivation layer;
a second etch stop layer over the capacitor;
a second passivation layer over the second etch stop layer, wherein the second passivation layer has a second porosity value lower than the first porosity value;
a first redistribution line penetrating through the second passivation layer and the second etch stop layer to electrically connect to the capacitor; and
a second redistribution line penetrating through the second passivation layer, the first passivation layer, and the first etch stop layer to electrically connect to the conductive feature.

17. The device of claim 16, wherein the first redistribution line is in contact with the second etch stop layer, and is vertically spaced apart from the first etch stop layer.

18. The device of claim 16 wherein the second redistribution line is in contact with the first etch stop layer, and is laterally spaced apart from the second etch stop layer.

19. The device of claim 16, wherein the first passivation layer and the second passivation layer are formed of a same dielectric material, with the first passivation layer having a lower dielectric constant than the second passivation layer.

20. The device of claim 16, wherein the second etch stop layer has a bottom surface forming an interface with a top surface of a capacitor electrode of the capacitor.

* * * * *